United States Patent

Wang et al.

[11] Patent Number: 5,901,086
[45] Date of Patent: May 4, 1999

[54] PIPELINED FAST-ACCESS FLOATING GATE MEMORY ARCHITECTURE AND METHOD OF OPERATION

[75] Inventors: Karl L. Wang; Jin-Uk "Luke" Shin, both of Austin, Tex.

[73] Assignee: Motorola, Inc., Schaumburg, Ill.

[21] Appl. No.: 08/780,120

[22] Filed: Dec. 26, 1996

[51] Int. Cl.⁶ .................................................. G11C 16/04
[52] U.S. Cl. .............................. 365/185.21; 365/185.25; 365/203; 365/205
[58] Field of Search ........................ 365/185.21, 185.18, 365/185.25, 189.05, 189.02, 233, 203, 205

[56] References Cited

U.S. PATENT DOCUMENTS

| | | |
|---|---|---|
| 4,893,278 | 1/1990 | Ito ............................................ 365/203 |
| 5,402,389 | 3/1995 | Flannagan et al. ....................... 365/233 |
| 5,592,435 | 1/1997 | Mills et al. ............................ 365/233.5 |
| 5,604,701 | 2/1997 | Alexander et al. ................. 365/189.02 |
| 5,657,292 | 8/1997 | McClure .................................. 365/233 |
| 5,784,705 | 7/1998 | Leung ................................ 365/189.05 |

*Primary Examiner*—Son Mai
*Attorney, Agent, or Firm*—Keith E. Witek; Kent J. Cooper

[57] ABSTRACT

A nonvolatile memory architecture (10) contains a plurality of memory arrays (12) formed by a plurality of floating gate memory cells and supports a 1X and 2X architecture. The nonvolatile memory design contains high voltage row decoders (16), low voltage row decoders (18), data multiplexors (24) and low voltage control circuitry (22). The nonvolatile memory architecture (10) features a pipelined scheme with a 100 MHz operation. Data multiplexers (24) and sense amplifier circuitry (26) with a master/slave portion increase the data access rate.

27 Claims, 10 Drawing Sheets

PIPELINED FAST-ACCESS FLOATING GATE MEMORY ARCHITECTURE AND METHOD OF OPERATION

RELATED APPLICATIONS

This is related to U.S. patent application Ser. No. 08/703, 176, filed on Aug. 23, 1996, and assigned to the current assignee hereof.

FIELD OF THE INVENTION

The present invention generally relates to memory devices and more specifically to electrically erasable programmable read only memories, EEPROM or flash memory, with pipeline operation to achieve improved data access rates.

BACKGROUND OF THE INVENTION

Flash memory devices are used in a variety of products including cellular phones and set-top boxes. Flash memory devices are flexible because the end user can program microcode and software at the last step in the manufacturing process. The ability to program at the last cycle in the manufacturing process enables the manufacturer to save money and cycle design time. Flash memory devices offer a wide variety of advantages including user flexibility and a variety of configurations; however, flash memory devices have some inherent disadvantages including slower speeds of data access than conventional volatile memories such as dynamic random access memory DRAM and static random access memory SRAM. Flash memory devices typically operate at maximal data access speeds of 45 to 50 MHz. Conventional volatile memories such as DRAM and SRAM currently operate much faster in a variety of applications. Flash memory is currently proposed for integration with digital signal processors DSPs on the same substrate for use in embedded applications. However, DSPs operate at system clock frequencies in excess of 100 MHz and the slower access rate of floating gate memory arrays are a significant limitation. Therefore, the speeds of flash memories have to increase to reduce DSP bottlenecks.

In addition to the slower speeds of access in floating gate arrays, flash memories currently do not offer random access capability at a high speed. Typically, a page mode access is used which further contributes to inefficient operation. A need exists for a stream-lined pipelined architecture to increase the speed and throughput of flash memory while maintaining random access.

Figure 1:
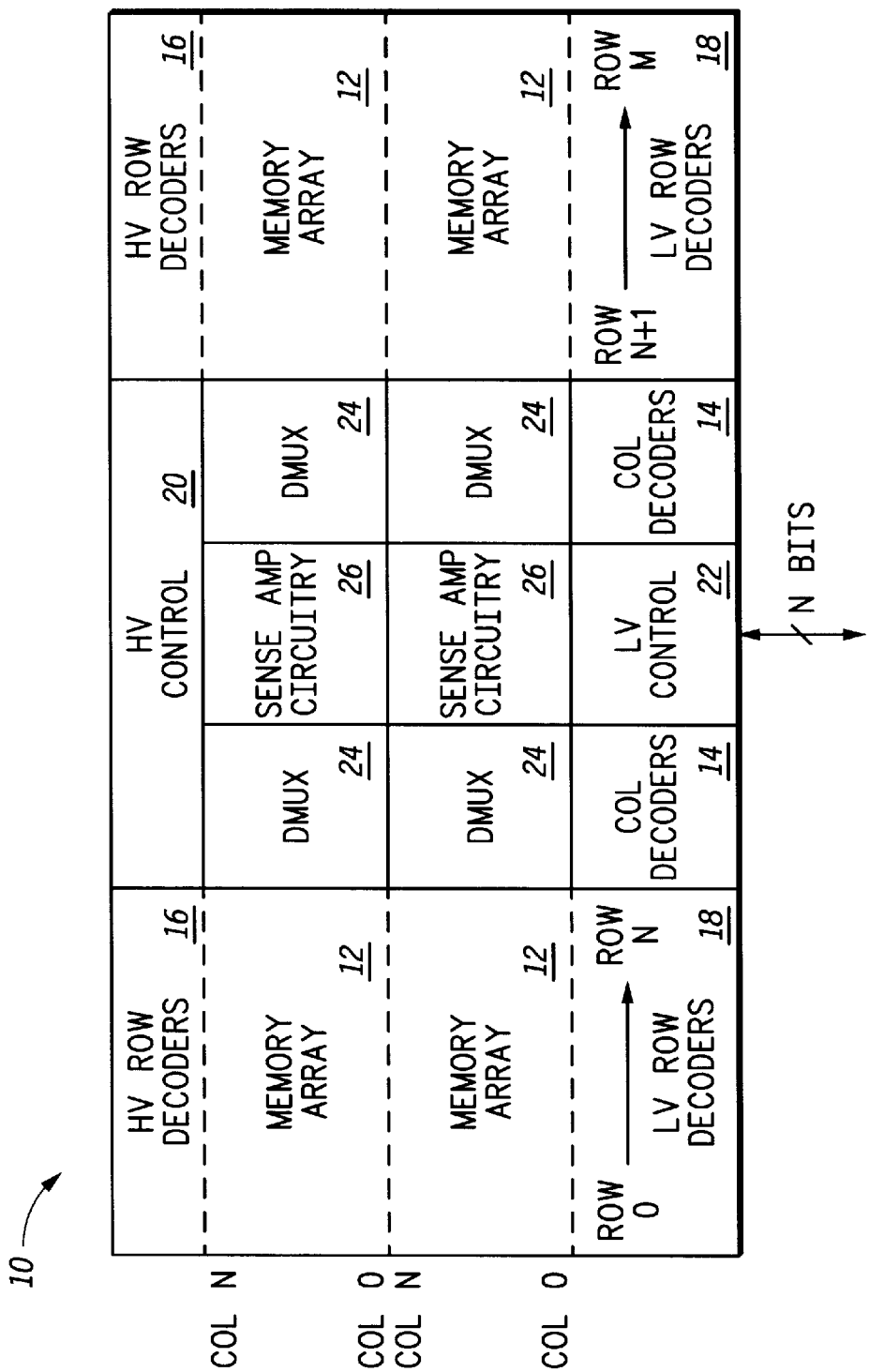
FIG. 1 illustrates a memory architecture in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is related to a floating gate memory system having a high speed rate of data access. In order to obtain this higher data access rate, unselected bit lines within the floating gate memory array have to be precharged to a certain voltage. In certain embodiments, this new precharge step may increase power consumption which can be traded-off against the increased speed of operation. In addition to bit line precharge, pipelining of the data accesses will greatly enhance the rate of data access from the memory array. A master/slave sensing configuration is used whereby the master performs data sense operation on a second read operation while the slave outputs data from a first read operation. In addition, the master, which has a first and second input, is balanced to enable more accurate sensing by proper switching within the sensing circuitry. The pipeline process takes multiple ticks wherein two or more of the multiple ticks are dedicated to data sensing to ensure proper data reads. To further the pipelining process, word line data and bit line data are latched within row and column decoders. In the same system, random access of memory cells is maintained. In addition, unselected bit lines are pulled low when selected bit lines are being programmed to avoid erroneous programming. When using this design, data access rates beyond 50 MHz are possible with access rates near or beyond 100 MHz being optimal. Therefore, this flash memory architecture may be embedded along with digital signal processors DSPs without creating a significant processing bottleneck.

The invention can be further understood with reference to FIGS. 1–10.

FIG. 1 depicts a memory architecture 10 in accordance with an embodiment of the invention. Memory architecture 10 comprises a plurality of memory arrays 12, wherein the plurality of memory arrays 12 are formed by a plurality of floating gate memory cells. Memory architecture 10 also comprises high voltage row decoders 16, low voltage row decoders 18, high voltage control circuitry 20, low voltage control circuitry 22, sense amplifier circuitry 26, data multiplexers 24, and column decoders 14. Memory architecture 10 sends and receives n bits of information via a bidirectional bus.

High voltage control circuitry 20 and low voltage control circuitry 22 control high voltage row decoders 16 and low voltage row decoders 18, respectively. Sense amplifier circuitry 26 symmetrically senses floating gate memory cells on either side of sense amplifier circuitry 26. Data multiplexers 24 are coupled to the output of the sense amplifier circuitry 26. Memory architecture 10 receives N bits of information to decode the rows and columns within the plurality of memory arrays 12. The low voltage row decoder 18 and high voltage row decoders 16 receive the N bits of information. The column decoders 14 also receive the N bits of information. The combination of the low voltage row decoders 18, high voltage row decoders 16 and column decoders 14 randomly access selected floating gate memory cells.

The memory architecture 10 offers many advantages including increased data throughput and efficiency. In a preferred embodiment the memory arrays consist of 128 columns and 256 rows and sense amplifier circuitry 26 has 16 sense amplifiers amplifying and launching the data stored in the selected floating gate memory cells residing on the selected rows and columns in the plurality of memory arrays 12. The output of the sense amplifier circuitry 26 comprises a tri-state driver that drives a 16 bit wide data bus. Each data multiplexer 24 selects 1 out of 8 bit lines to connect to a data line. The advantages of the memory architecture 10 includes increased sense capabilities in a pipelined method. Advantages include the flexibility of using both a low voltage row decoder 18 and a high voltage row decoder 16. Another advantage of the memory architecture 10 is the increased access speed. It should be appreciated that the present invention allows random access speeds of as high as 100 MHz.

Figure 2:
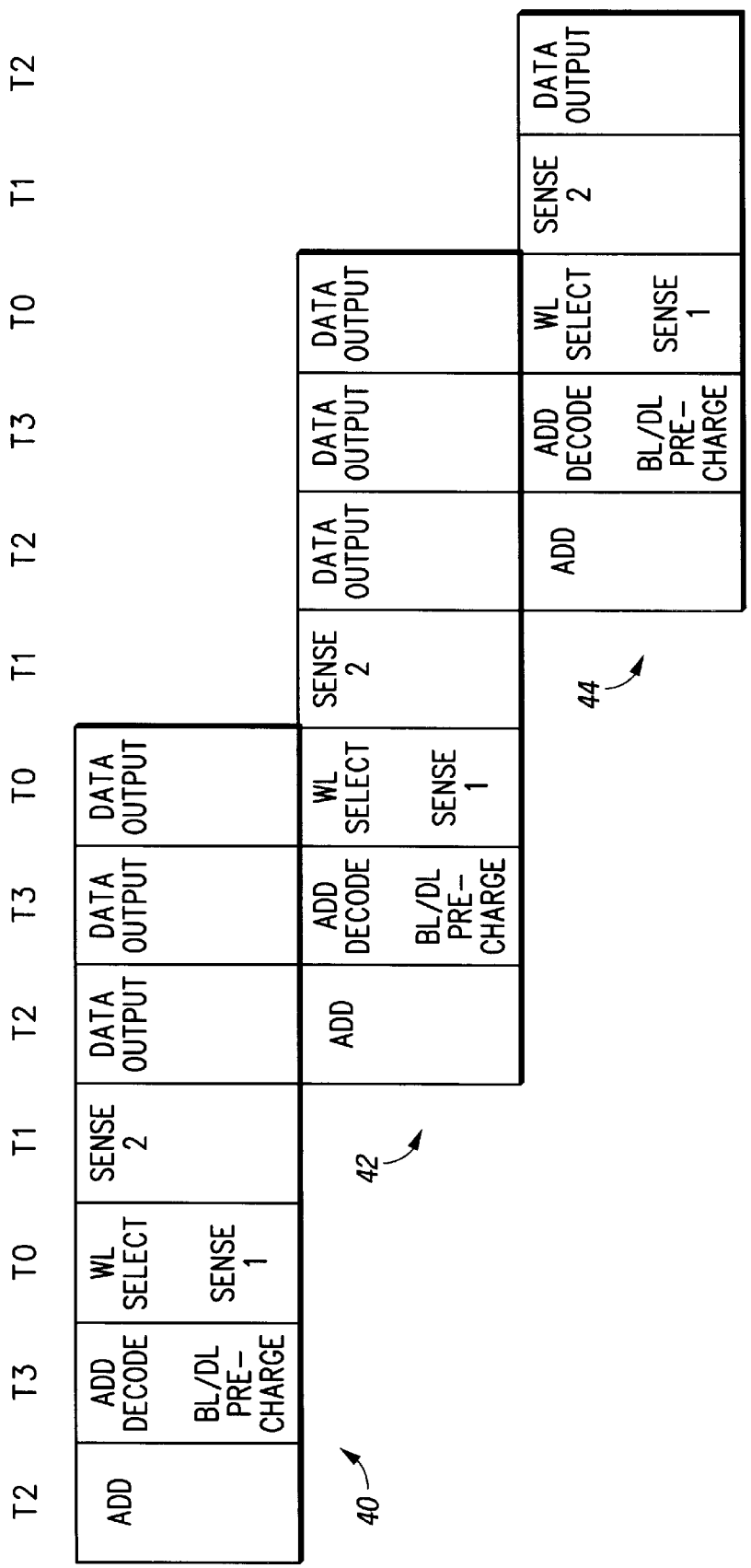
FIG. 2 illustrates an instruction sequence for a 2X architecture in accordance with the present invention.

FIG. 2 illustrates a time cycle for a set of instruction sequences provided to the memory architecture 10 in accordance with one embodiment of the invention. A first instruction sequence 40 comprises the following instructions of receiving a N bit address, latching and decoding the N bit address, selecting a wordline, selecting and precharging the bit line and the data line, sensing the selected floating gate memory cell, and transmitting or outputting the data. A second instruction sequence 42 and a third instruction sequence 44 comprise the same seven pipelined states as illustrated for the first instruction sequence 40. The instructions 40, 42 and 44 feature a pipelined architecture wherein states of each of the pipelined instructions 40, 42, and 44 overlap thereby increasing efficiency of data accesses within the plurality of floating gate memory cells.

The first instruction sequence 40 spans a sequence of clock ticks T2, T3, T0, T1, T2, T3 and T0. The first data value will be output after a 3 tick latency, and thereafter, data will appear every four pipeline ticks on T2. Starting with tick 2 (T2) an address corresponding to a data element stored within the memory array is provided to the memory architecture 10. In clock tick T3 the address is optionally latched and decoded. And at a time overlapping with the address decoding, the bit line and data line within the architecture 10 are precharged to 1.2 volts or a like operational voltage. Precharging the selected bit line and data line in clock tick T3 allows quicker sensing in the next clock tick thereby increasing the access speed of the floating gate memory. Clock tick T0 selects the appropriate word line after the row decoders determine which row to sense. Also, the first part of the sense operation (sense 1) occurs in clock tick T0 simultaneous with the selection of the wordline. In clock tick T1 the second part of the sense (sense 2) is performed. In other words, the four state pipeline methodology of FIG. 2 (T0–T3 is a four state pipeline) has a two tick sensing operation. By using two ticks to perform sensing, the frequency of operation of the entire sequence 40 can be increased without compromising sensing integrity. Upon the completion of sense 2 and clock T1 the data is output in clock tick T2 and held valid two more clock ticks, T3 and T0, completing the instruction sequence 40. It should be appreciated that the architecture 10 could maintain the data output for sequence 40 from T2 until the following T2 in order ensure that proper hold times and set-up times are achieved.

At the corresponding time that the clock tick T2 starts in instruction sequence 40, instruction sequence 42 begins in dock tick T2 via a new address being received. Therefore, during certain time periods, the memory architecture 10 is processing two memory read operations simultaneously. In dock tick T3, the new address is decoded and optionally latched. At the same time, the bit line and data line are precharged to 1.2 volts or a like operational voltage. Precharging a bit line and data line to 1.2 volts prepares these lines for sensing within the following tick T0. In clock tick T0 the word line is selected or enabled and the first tick of the two tick sensing operation (sense 1) is started. In clock tick T1 the second part of the sense operation (sense 2) starts. In clock tick T2, the data for a second read operation is output and held valid for two more clock ticks, T3 and T0. At the same time, instruction sequence 44 starts by receiving yet another address.

In clock tick T3, the address for sequence 44 is decoded and optionally latched. The bit line and data line are precharged to 1.2 volts or a like operational voltage which allows the two-tick sensing operation to start in dock tick T0. Also in dock tick T0 the word line is selected or enabled. In clock tick T1, the second part of the two-tick sensing operation (sense 2) begins. In clock tick T2, the data is output and held valid for two more clock ticks, T3 and T0, completing the instruction sequence 44. Therefore, the pipeline process taught in FIG. 2 is a two-tick sample process with data accesses occurring every 4 ticks after the initial 3 tick latency for the very first data read.

The advantages of the pipeline technique of FIG. 2 include faster data access rate while maintaining enough sense time to ensure data integrity. FIG. 2 illustrates a pipelined architecture which increases the efficiency and throughput of the floating gate memory architecture allowing multiple instruction sequences to overlap in time. Advantages of this pipeline architecture include multiple operations occurring in the same clock tick, two-tick sensing, three tick data holding, higher clocking frequencies, while maintaining random access capability. For example, the pipeline technique of FIG. 2 can be used to improve the data access rate for EEPROM, EPROM, flash memory, and like memory designs. The pipeline technique of FIG. 2 can be used to provide a new data value every two system clocks. Therefore, the pipeline technique of FIG. 2 is referred to as a 2X access technique.

Figure 3:
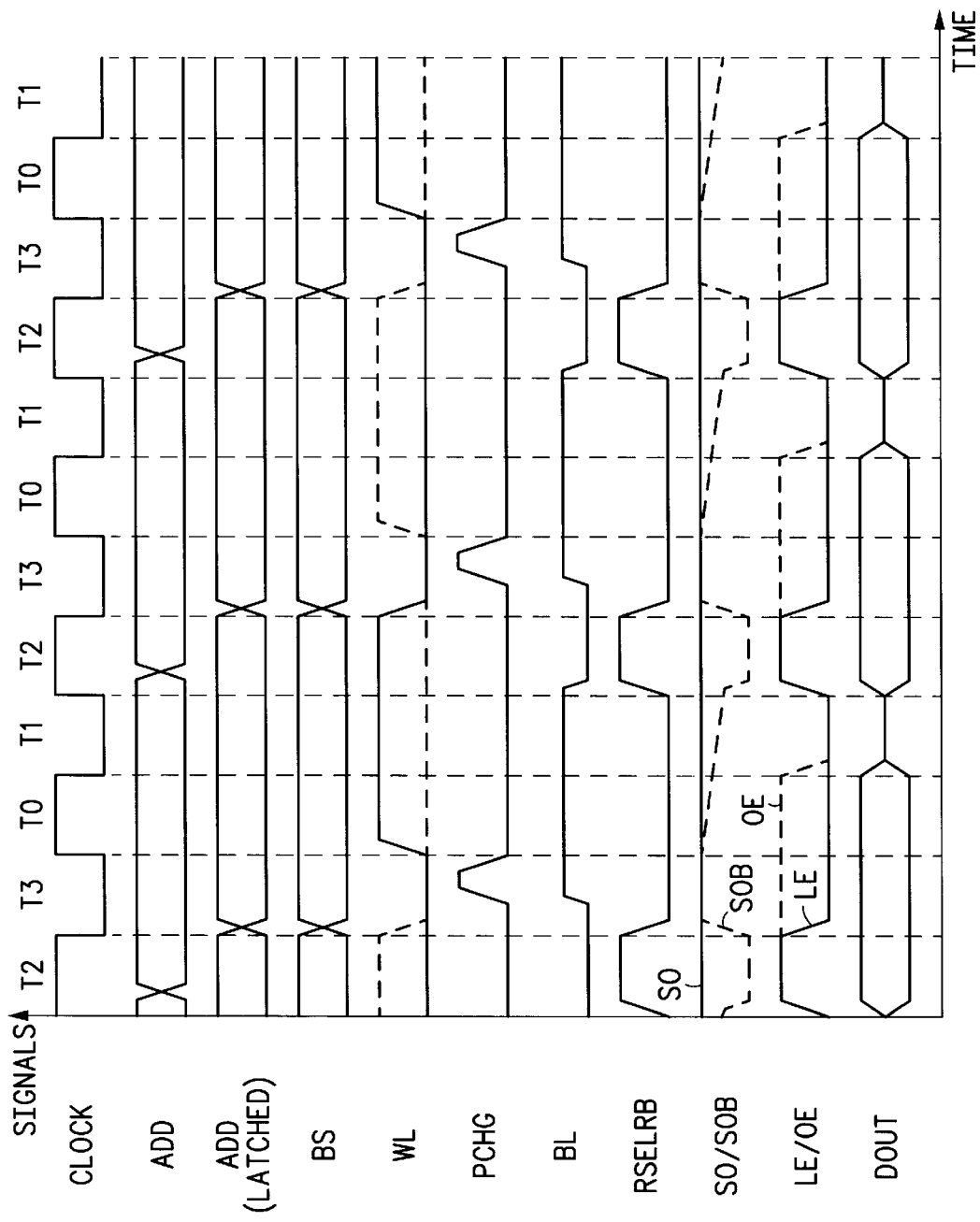
FIG. 3 illustrates a timing diagram for the instruction sequence depicted in FIG. 2, in accordance with the present invention.

FIG. 3 depicts a timing diagram in accordance with the pipeline technique of FIG. 2. In FIG. 3, a system clock for an integrated circuit containing the memory architecture 10 operates at the same frequency of the tick clock provided to memory architecture 10. Therefore, every two system clocks, a data output is provided from the memory cells within the memory architecture 10. Instruction sequence 40 from FIG. 2 is depicted in FIG. 3 in timing diagram form. In clock tick T2 of FIG. 3, the address (ADD) is received as illustrated in the first T2 of FIG. 2. In clock tick T3 the address for sequence 40 is latched via ADD (LATCHED) and the block select BS is decoded from the latched address which precharges the bit line and data line to a 1.2 voltage level or a like voltage value. In clock tick T3, the signal (PCHG) selects the bit line and precharges it to a 1.2 voltage level. In clock tick T0 the first sense operation (sense 1)

starts. In clock tick T0, the word line (WL) is selected as indicated by the solid line of WL in tick T0 of FIG. 3. The unselected word lines are indicated by the dashed line in T0 of FIG. 3. Also, in clock tick T0, the selected bit line (BL) is sensed via the sense 1 operation of FIG. 2. In clock tick T0, the signal RSELRB is active low and activates the pass gates of the sense amplifier which begins first tick of a two-tick sense operation (see FIG. 8).

In clock tick T1, the sense operation completes the second tick of the two-tick sense operation (sense 2) as indicated by the SO/SOB signal of FIG. 3. In clock tick T2, the latch enable (LE) and output enable (OE) are activated to provide the output data (DOUT) in FIG. 3. The signal LE/OE is used to transfer the sensed data value from the master latch to the slave latch portion and provide the data output (DOUT) from the slave latch portion (see FIG. 8). The output enable (OE) enables the data output (DOUT) to be transmitted to other circuitry.

FIG. 3 illustrate a pipelined architecture which increases the speed of operation of memory read accesses. For example, using the system illustrated in FIG. 3 will result in data being provided every four dock ticks which is every two system clock cycles.

Figure 4:
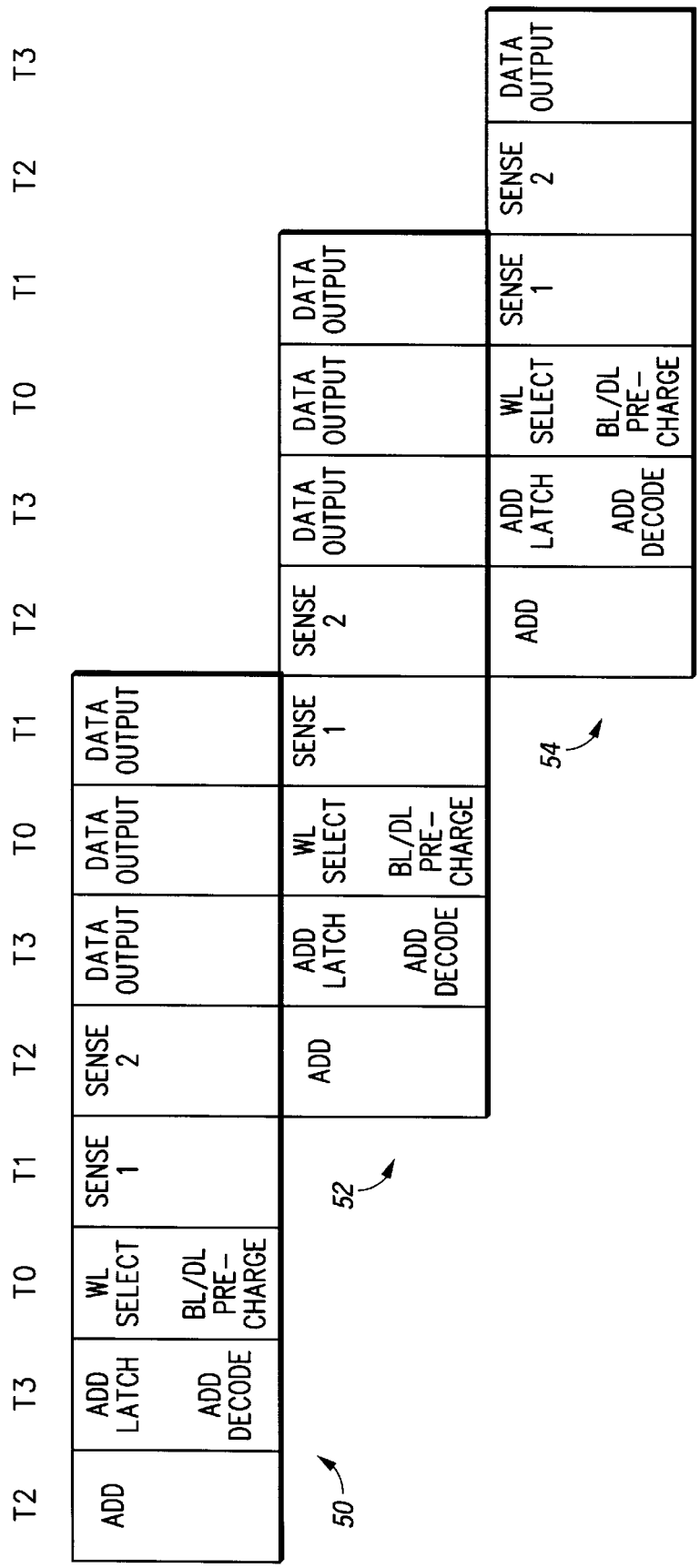
FIG. 4 illustrates an instruction sequence for a 2X architecture in accordance with a second embodiment of the present invention.

FIG. 4 illustrates a timing diagram for an alternate embodiment of a 2X architecture different from that illustrated in FIGS. 2–3. FIG. 4 depicts instruction sequence 50, instruction sequence 52, and instruction sequence 54. Instruction sequence 50 starts with clock tick T2 and ends with the second clock tick T1. A four state pipeline process using four ticks (T0–T3) is illustrated in FIG. 4. Starting with clock tick T2 for instruction sequence 50 the address (ADD) is received for a first memory access. In clock tick T3, the address (ADD) for the first memory access is latched and the address is decoded. In clock tick T0, the word line (WL) is selected, and the bit line and data line are precharged to 1.2 volts or a like operational voltage. In clock tick T1, the two-tick sense operation begins via sense 1. In clock tick T2, the second portion of the two-tick sense operation (sense 2) is performed. The data for the first memory read of sequence 50 is output in tick T3 and is held valid for dock tick T0 and T1, completing the instruction sequence 50.

Referring back to second clock tick T2 for instruction sequence 50 where the sense 2 operation is occurring, the instruction sequence 52 starts by receiving an address for a second memory read operation. Also, referring back to clock tick T3, while data is being output for a first read operation via sequence 50, the address is latched for sequence 52. This address for the sequence 52 is also decoded in dock tick T2. In clock tick T0, the word line (WL) is selected and the bit line (BL) and data line (DL) are precharged to 1.2 volts for the read of sequence 52. The two-tick sense operation begins for the sequence 52 in clock tick T1 via sense 1. The second portion of the two-tick sense operation (sense 2) is performed in clock tick T2. In the same clock tick T2 where the sense 2 operation is performed, yet another address is received for instruction sequence 54. The data for sequence 52 is output in clock tick T3 and is held valid for clock tick T0 and T1. Also, in dock tick T3, the address for instruction sequence 54 is latched and this address is decoded. In clock tick T0, the word line (WL) is selected and the bit line (BL) and data line (DL) are precharged to 1.2 volts or a like operational voltage. A two-tick sense operation begins with sense 1 in clock tick T1, and this sense operation completes in dock tick T2 with a sense 2 operation. Upon completion of the two-tick sense operation for sequence 54, the data for sequence 54 is output in T3 thereby completing the instruction sequence 54. Therefore, the pipelined process of FIG. 4 is a 2X process which provides one data output value every two system clocks. The process of FIG. 4 is a 2:2:2:2 . . . pipeline process wherein a first data element is output after a latency of 4 clock ticks and all subsequent data outputs occur within 4 clock ticks of each other.

The advantages of FIG. 4 include a pipelined architecture for providing multiple pipelined data values via the instruction sequences 50, 52 and 54. The pipelined architecture offers increased data throughput and speeds of at least 50 MHz and optionally at or above 100 MHz. FIG. 4 illustrates a pipelined architecture which increases the efficiency and throughput of the floating gate memory architecture allowing multiple instruction sequences to overlap in time. Advantages of this pipeline architecture include multiple operations occurring in the same dock tick, two-tick sensing, up to four tick data holding, higher docking frequencies, while maintaining random access capability. For example, the pipeline technique of FIG. 4 can be used to improve to data access rate for EEPROM, EPROM, flash memory, and like memory designs. The pipeline technique of FIG. 4 can be used to provide a new data value every two system clocks. Therefore, the pipeline technique of FIG. 4 is referred to as a 2X access technique.

Figure 5:
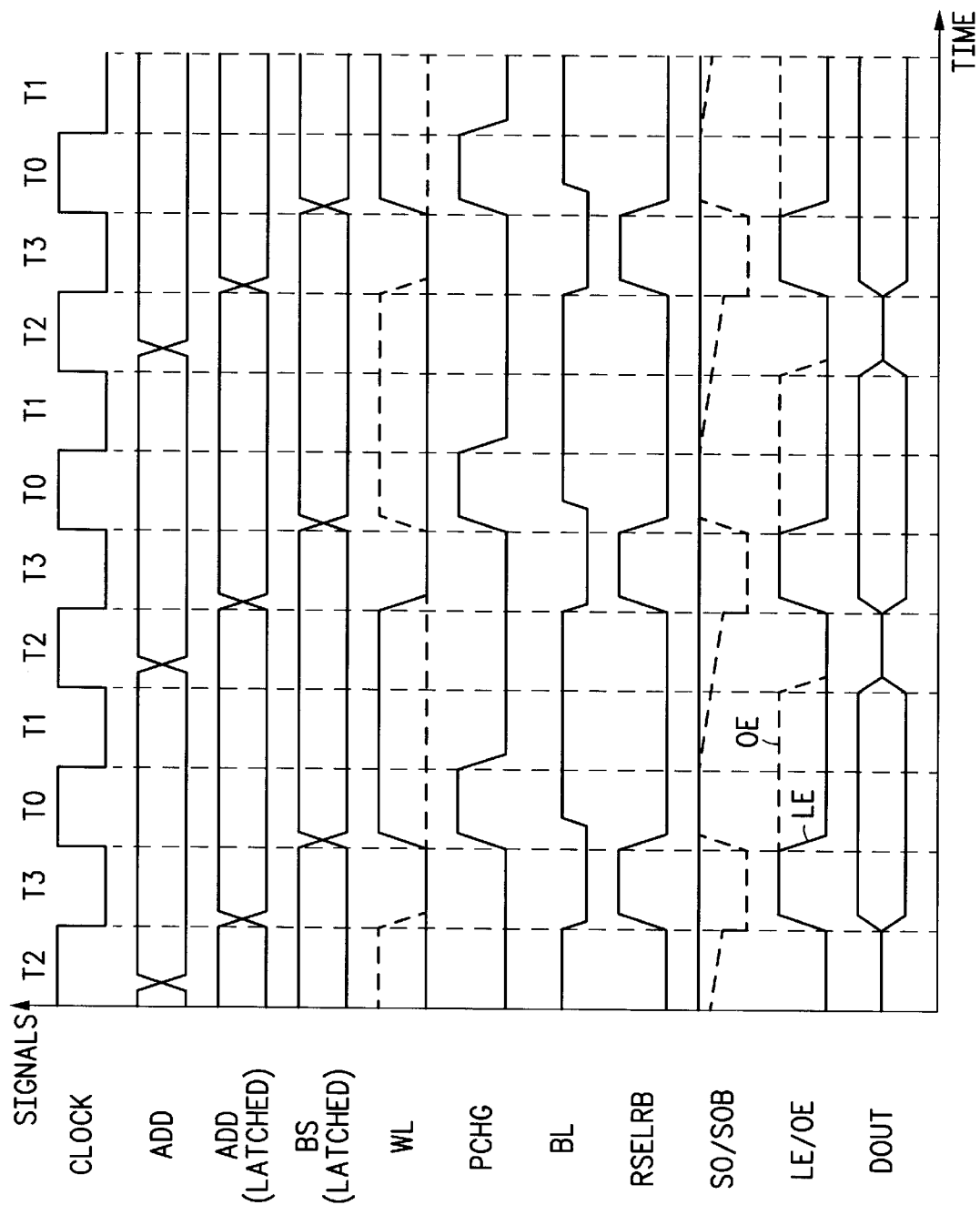
FIG. 5 illustrates a timing diagram for the instruction sequence depicted in FIG. 4 in accordance with the present invention.

FIG. 5 depicts a timing diagram in accordance with the pipeline technique of FIG. 4. In FIG. 4, a system clock for an integrated circuit containing the memory architecture 10 operates at the same frequency of the tick clock provided to memory architecture 10. Therefore, every two system clocks, a data output is provided from the memory cells within the memory architecture 10. Instruction sequence 50 from FIG. 4 is depicted in FIG. 5 in timing diagram form. In clock tick T2 of FIG. 5, the address (ADD) is received as illustrated in the first T2 of FIG. 4. In clock tick T3 the address for sequence 50 is latched via ADD (LATCHED) and decoded. In clock tick T0, the signal (PCHG) selects the bit line and precharges it to a 1.2 voltage level or like operational voltage, and the wordline (WL) is selected as indicated by the solid line in FIG. 5. The unselected word lines are indicated by the dashed line in T0 of FIG. 5. In clock tick T1 the first sense operation (sense 1) starts. Also, in clock tick T1, the selected bit line (BL) is sensed via the sense 1 operation of FIG. 4. In clock tick T2, the sense operation completes the second tick of the two-tick sense operation (sense 2) as indicated by the SO/SOB signal of FIG. 5. In clock tick T0, the signal RSELRB is active low and activates the pass gates of the sense amplifier which begins sensing in clock ticks T0–T2. Note, this pipeline technique in reality allows for a slightly longer sense time than a two tick sense.

In clock tick T3, the latch enable (LE) and output enable (OE) are activated to provide the output data (DOUT) in FIG. 5. The signal LE/OE is used to transfer the sensed data value from the master latch to the slave latch portion and provide the data output (DOUT) from the slave latch portion (see FIG. 8). The output enable (OE) enables the data output (DOUT) to be transmitted to other circuitry.

FIG. 5 illustrates a pipelined architecture which increases the speed of operation of memory read accesses. For example, using the system illustrated in FIG. 5 will result in pipelined data being provided every four dock ticks which is every two system clock cycles. It should be appreciated that bursts can be performed with the pipeline technique of FIGS. 2–3 in a first set of circumstances and that the pipeline technique of FIGS. 4–5 can be used on the same memory architecture.

Figure 6:
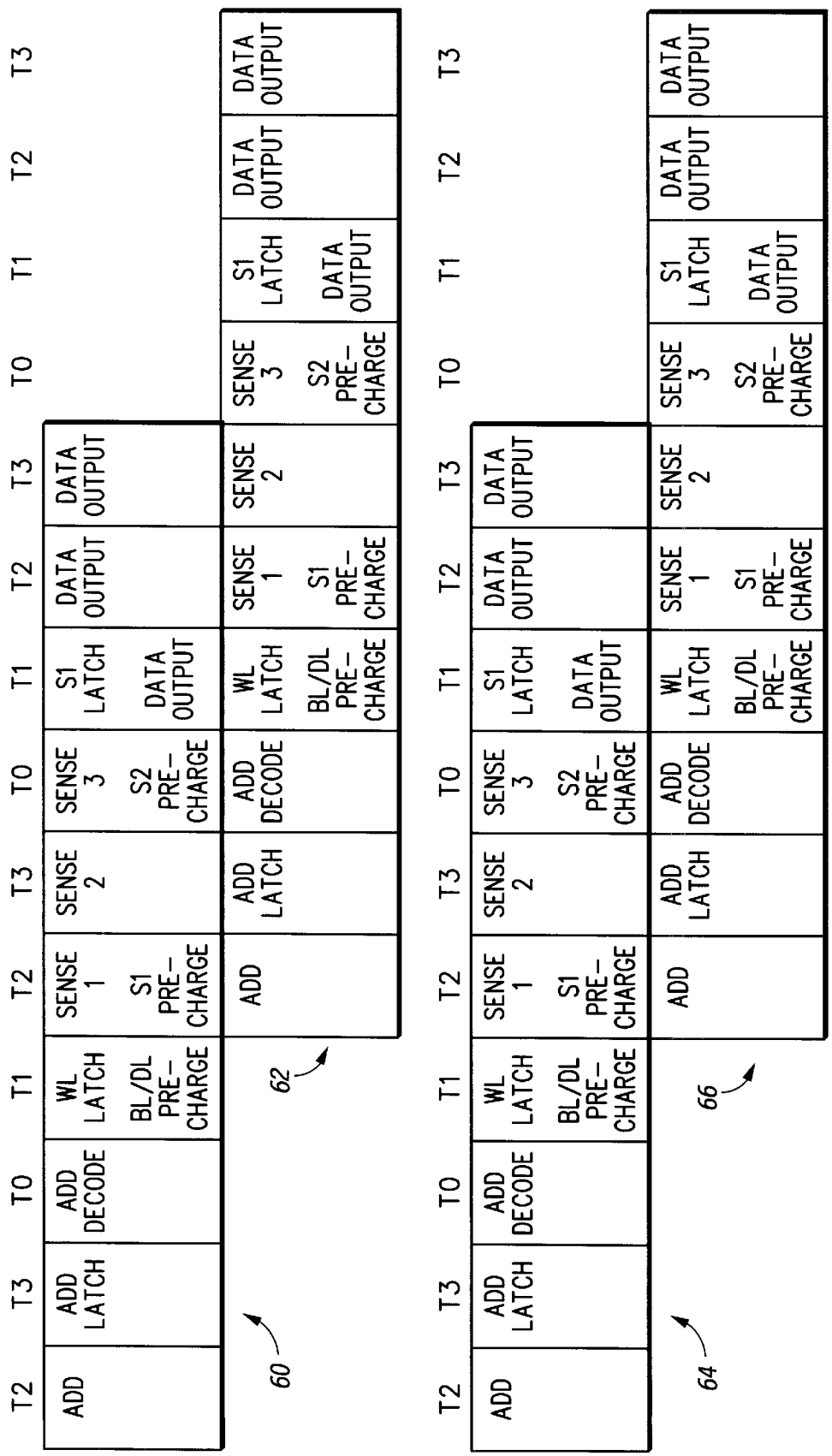
FIG. 6 illustrates an instruction sequence for a 1X architecture in accordance with the present invention.

FIG. 6 illustrates a pipeline process for a 1X architecture with instruction sequences 60, 62, 64, and 66. In other words, every system clock, a new data output is provided after the first read/latency of the pipeline has been incurred. Instruction sequence 60 begins with receiving the address for the first sequence 60 in dock tick T2. The address for sequence 60 is latched in clock tick T3. This address is decoded in clock tick T0. The word line (WL) is latched or enabled and the bit line (BL) and data line (DL) are precharged to 1.2 volts or a like operational voltage in clock tick T1. A three-tick sensing operation begins with sense 1 in clock tick T2, and the master latch (S1) precharge also begins in clock tick T2 (see master 114 of FIG. 8). In clock T2, the address for a second read operation performed via sequence 62 is received. The sense operation of sequence 60 continues with the sense 2 operation in clock tick T3. In clock T3, the address from sequence 62 is latched. The three-tick sensing of sequence 60 ends via sense 3 in clock tick T0. Also in clock tick T0, the slave latch (S2) precharge in the sense circuitry occurs in clock tick T0 (see slave 118 of FIG. 8). In T0, the address for sequence 62 is decoded. In clock tick T1, the master latches and the data output (DOUT) begins. In clock tick T1, the word line (WL) is latched or enabled and the bit line (BL) and data line (DL) are precharged to 1.2 volts or a like operational voltage for the sequence 62. The data provided for sequence 60 is held valid by the slave 118 (see FIG. 8) for clock ticks T1 through T3 in FIG. 6.

In tick T2 when the data from sequence 60 is being provided, the sensing of the data from sequence 62 begins via sense 1 and the master 114 (see FIG. 8) is precharged for the sense operation for sequence 62. In addition, in tick T2, the address is provided for a sequence 64. While the data for sequence 60 is being provided in tick T3, the second tick of sensing is occurring for sequence 62. Furthermore, in tick T3, the address for sequence 64 is being latched. Therefore, there are two ticks in FIG. 6 wherein three read operations are being simultaneously processed within the memory architecture.

Pipelining continues as illustrated in FIG. 6 wherein T0–T3 can repeat indefinitely for any number of memory reads after the initial pipeline starting latency has occurred. Therefore, sequences 60, 62, 64, and 66 finish processing in a pipelined manner. The pipeline process of FIG. 6 has a latency of 6 ticks or 1.5 system clocks whereby data is output after the start-up latency every 4 ticks or 1 system clock. Therefore, the pipeline is a 1.5:1:1:1: . . . architecture.

The advantages of FIG. 6 include a pipelined architecture for providing multiple pipelined data values via the instruction sequences 60–66. The pipelined architecture offers increased data throughput and speeds of at least 80 MHz and optionally at or above 100 MHz. FIG. 6 illustrates a pipelined architecture which increases the efficiency and throughput of the floating gate memory architecture allowing multiple (three or more) instruction sequences to overlap in time. Advantages of this pipeline architecture include multiple operations occurring in the same clock tick, three-tick sensing, a 2× tick clock when compared to the system clock, up to three tick data holding, higher docking frequencies, while maintaining random access capability. For example, the pipeline technique of FIG. 6 can be used to improve to data access rate for EEPROM, EPROM, flash memory, and like nonvolatile memory designs. The pipeline technique of FIG. 6 can be used to provide a new data value every system clocks after start-up latency is overcome. Therefore, the pipeline technique of FIG. 4 is referred to as a 1X access technique.

Figure 7:
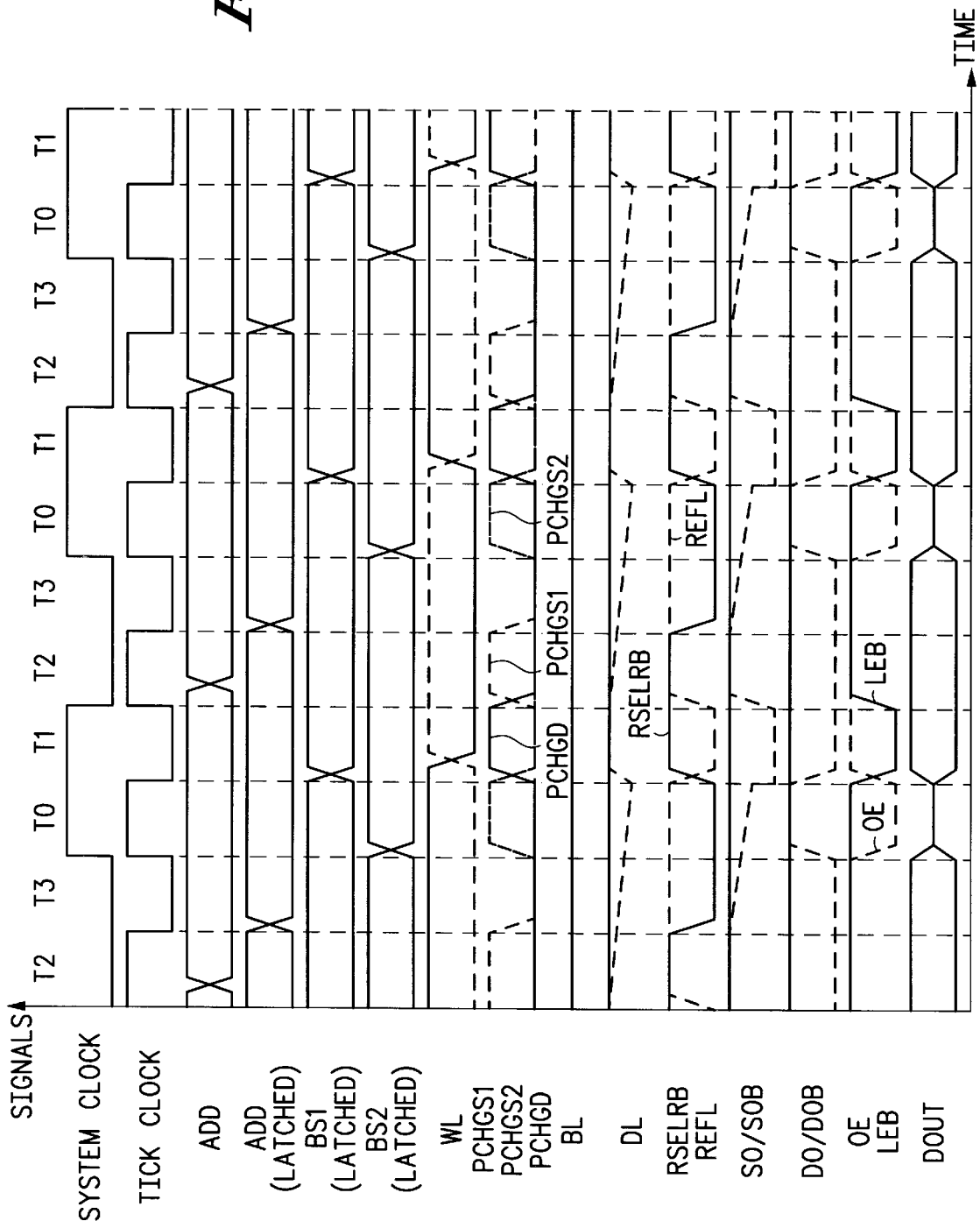
FIG. 7 illustrates a timing diagram for the instruction sequence depicted in FIG. 6 in accordance with the present invention.

FIG. 7 indicates a timing diagram associated with FIG. 6 for a 1X pipelined architecture. The system clock toggles every 2 clock ticks indicating a 1X architecture. In clock tick T2 the address for instruction sequence 60 is received and this address is latched in clock tick T3. The first block select BS1 is latched in clock tick T1 and the second block select BS2 is latched in the following clock tick T0. The word line (WL) is selected and the bit line (BL) and the data line (DL) are precharged in clock tick T1 indicated by WL and DL respectively. The word line (WL) is selected in clock tick T1 as indicated by the dashed line in clock tick T1. Three-tick sense operation begins in clock tick T2 indicated by the DL signal. PCHGS1 selects precharging for the master latch 114 (see FIG. 8) in the sense circuitry in clock tick T2. The sense operation continues in clock tick T3. In dock tick T0 the slave latch (S2) precharge begins with the PCHGS2 for the slave latch 118 in the sense circuitry (see FIG. 8). The master latch 114 (See FIG. 8) is latched in clock tick T1 and the data is output (DOUT) in clock tick T1. The data is output by the output enable (OE) signal, and the data (DOUT) is held valid for a total of 3 clock ticks, clock ticks T1, T2 and T3 to ensure set-up and hold times within the architecture.

The advantages of FIG. 7 include a pipeline architecture increasing over all speed and data throughput. Three instruction sequences are simultaneously performed by the 1X system illustrated in FIGS. 6–7. For example, instruction sequences 60, 62, and 64 are all being simultaneously processed in clock ticks T2 and T3 of FIGS. 6–7.

Figure 8:
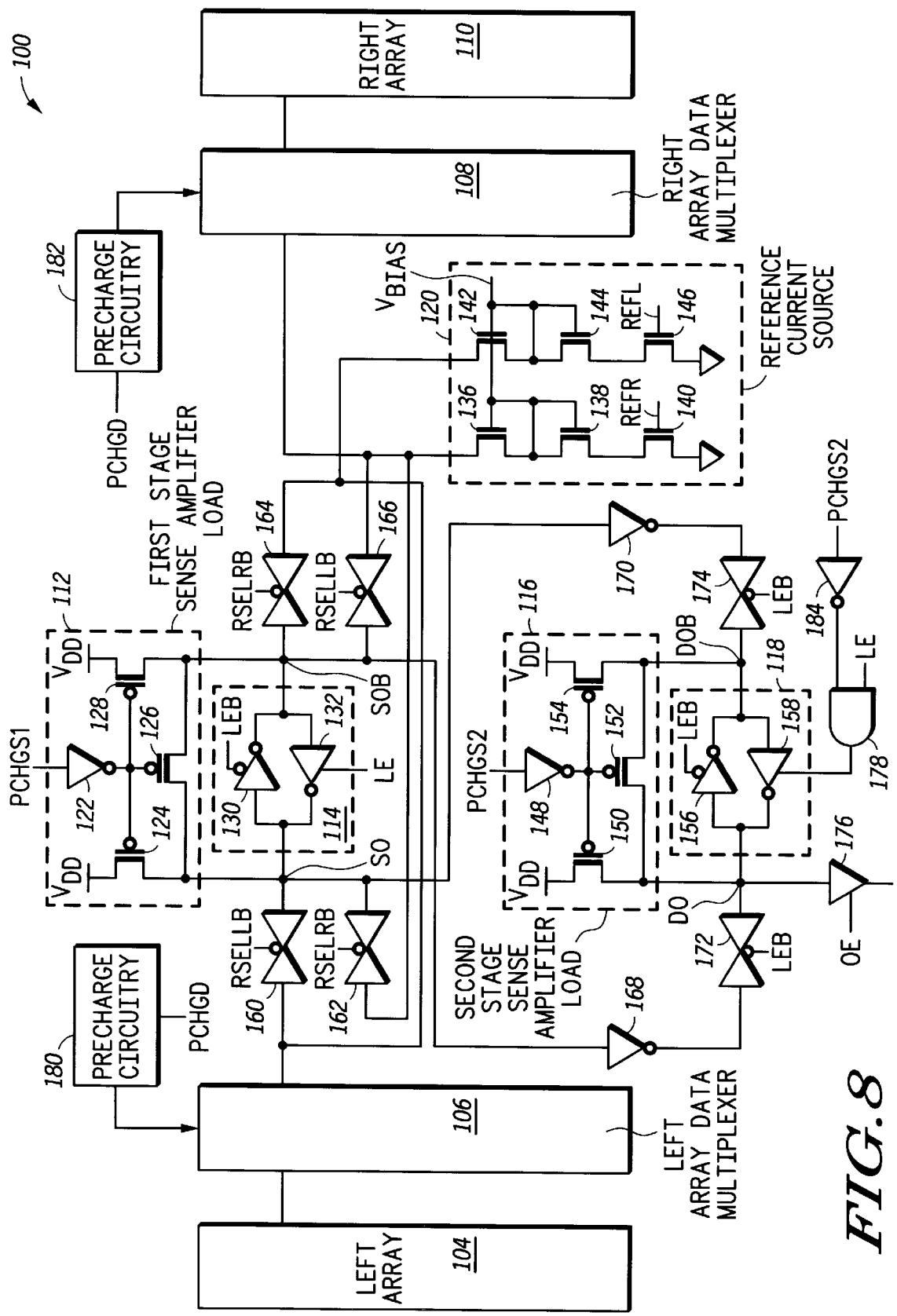
FIG. 8 illustrates sensing circuitry block diagram and circuit schematic in accordance with the present invention.

Shown in FIG. 8 is a circuit diagram in accordance with one embodiment of the present invention. Circuit diagram 100 comprises a left memory array 104 comprising a plurality of EEPROM memory cells, a left array data multiplexer 106, a right array data multiplexer 108, a right memory array 110 comprising a plurality EEPROM memory cells, a first stage sense amplifier load 112, a first stage sense amplifier 114, a second stage sense amplifier load 116, a second stage sense amplifier 118, a reference current source 120, pass gates 160, 162, 164, 166, 172 and 174, buffer 176, inverters 168, 170 and gate 178 and precharged circuitry 180 and 182. The first stage sense amplifier load 112 comprises an inverter 122, a pmos transistor 124, a pmos transistor 126 and a pmos transistor 128. The first stage sense amplifier 114 comprises an inverter 130 and an inverter 132. The second stage sense amplifier load 116 comprises an inverter 148, a pmos transistor 150, a pmos transistor 152 and a pmos transistor 154. The second stage sense amplifier 118 comprises an inverter 156 and an inverter 158. Reference current source 120 comprises an nmos transistor 136, an nmos transistor 138 and an nmos transistor 140, an nmos transistor 142, an nmos transistor 144, and an nmos transistor 146. Left memory array 104 is coupled to left data multiplexer 106. The precharge circuitry 180 which receives a precharge signal as an input is electrically coupled to left data multiplexor 106. The left data multiplexor 106 is also coupled to pass gate 160 and pass gate 164. Similarly, right memory array 110 is coupled to right data multiplexor 108, and precharge circuitry 182 is coupled to right data multiplexor 108. The pass gate 162 and pass gate 166 are in turn coupled to right data multiplexor 108. In first stage sense amplifier load 112 the input of inverter 122 is coupled to a precharged signal and the output of inverter 122 is coupled to the gate electrodes of pmos transistor 124, pmos transistor 126, and pmos transistor 128. The source of pmos transistor 124 and the source of pmos transistor 128 are coupled to VDD. The drain of pmos transistor 124 is coupled to pass gate 160 and pass gate 162. Similarly, the drain of pmos transistor 128 is coupled to pass gate 164 and pass gate 166. In addition, the drain of pmos transistor 124 is coupled to the input of inverter 170 and to the input of inverter 130 and the output of inverter 132 within first stage sense amplifier 114. Similarly, the drain of pmos transistor 128 is coupled to the output of inverter 130 and the input of inverter 132 within first stage sense amplifier 114 and to the input of inverter 168. As shown in FIG. 8 the output of inverter 130 is coupled to the input of inverter 132 and the output of inverter 132 is coupled to the input of inverter 130. The output of inverter 168 is coupled pass gate 172 and the output of inverter of 170 is coupled to pass gate 174. Inverter 148 within second stage sense amplifier load 116 receives a precharge signal, PCHGS2, as an input and the output of inverter 148 is coupled to the gate electrodes of pmos transistor 150, pmos transistor 152, and pmos transistor 154. The source of pmos transistor 150 and the source of pmos transistor 154 are coupled to VDD. The drain of pmos transistor 150 is coupled to pass gate 172, second stage sense amplifier 118, and to the input of inverter 176. More specifically, the drain of pmos transistor 150 is coupled to the input of inverter 156 and to the output of inverter 158 within second stage sense amplifier 118. Similarly, the drain of pmos transistor 154 is coupled to pass gate 174 and to the output of inverter 156 and the input of inverter 158 within second stage sense amplifier 118. The output of the AND gate 178 is coupled to inverter 158. The AND gate 178 receives two inputs, a latch enable signal, LE, and a precharge signal, PCHGS2, from an inverter 184. In addition, pass gate 172 and pass gate 174 receive latch enable bar signal, LEB, as an input. Buffer 176 receives an output enable signal, OE, as an input. Within reference current source 120 the source of nmos transistor 140 is coupled to ground and the drain of nmos transistor 140 is coupled to the source of nmos transistor 138. The drain of nmos transistor 138 is coupled to the source of nmos transistor 136 and the drain of nmos transistor 136 is coupled to pass gate 162, pass gate 166, and to right data multiplexor 108. Similarly, the source of nmos transistor 146 is coupled to ground and the drain of nmos transistor 146 is coupled to the source of nmos transistor 144. The drain of nmos transistor 144 is coupled to the source of nmos transistor 142 and the drain of nmos transistor 142 is coupled to pass gate 164, pass gate 160, and left data multiplexor 106. In addition, the source of nmos transistor 136 and the drain of nmos transistor 138 is coupled to a voltage bias signal, VBIAS. Similarly, the source of nmos transistor 142 and the drain of nmos transistor 144 is also coupled to the same voltage bias signal, VBIAS. As shown in FIG. 8, the gate electrode of nmos transistor 136 and nmos transistor 138 and nmos transistor 142 and nmos transistor 144 are also coupled to the voltage bias signal, VBIAS. The gate electrode of nmos transistor 140 is coupled to the reference current right select signal, REFR, and the gate electrode of nmos transistor 146 is coupled to the reference current left select signal, REFL. In addition, pass gate 160 and pass gate 166 receive the row select left signal, RSELLB, as an input. Similarly, pass gate 162 and pass gate 164 receive the row select right signal, RSELRB, as an input.

Figure 9:
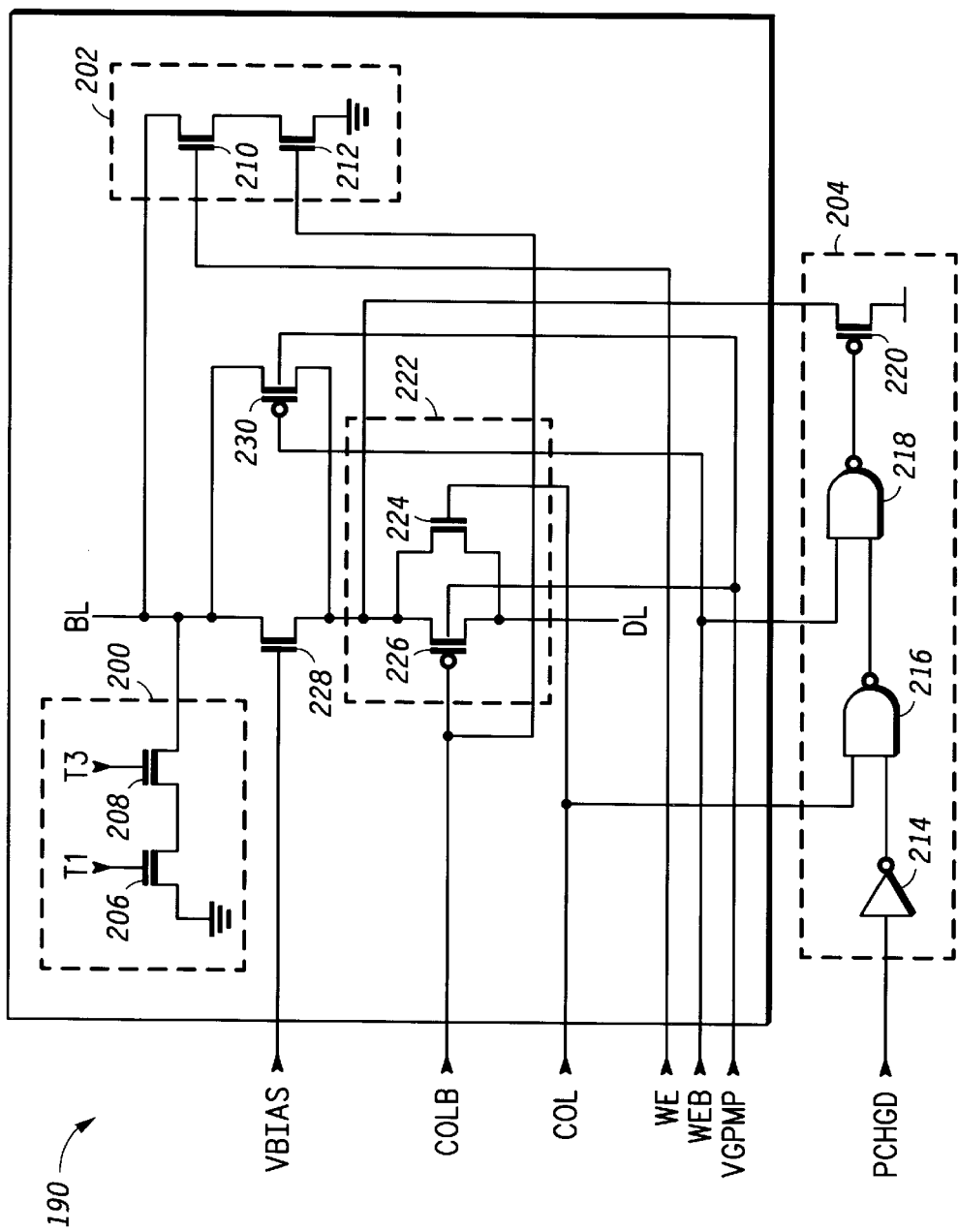
FIG. 9 illustrates a detailed circuit schematic in association with FIG. 8 in accordance with the present invention.

FIG. 9 illustrates a detailed circuit schematic in association with FIG. 8. FIG. 9 illustrates circuit schematics for the data multiplexors and the bit line precharging method. The bit line precharging is in the block diagram 204. Block diagram 204 receives a precharge control signal PCHGD. Invertor 214 receives precharge signal PCHGD at an input. Invertor 214 generates the complement of the PCHGD signal and provides as one input to a NAND gate 216. A column select signal, COL, is provided to another input of the NAND gate 216. An output of the NAND gate 216 is provided to a first input of a NAND gate 218. A complement of the write enable signal, WEB, is provided to a second input of the NAND gate 218. An output of NAND gate 218 is coupled to the gate of a pmos transistor 220. A drain of transistor 220 is coupled to the drain of a nmos transistor 228. A source of transistor 220 is coupled to power supply VDD. The data multiplexor 24 is illustrated in the block diagram 190. The data multiplexor 24 receives a bias voltage, VBIAS, a complement of column select signal, COLB, a column select signal, COL, a write enable signal, WE, and a complement of the write enable signal, WEB. A bias voltage signal is provided to the gate of nmos transistor 228. A bit line is coupled to the source of transistor 228 and to a source of pmos transistor 230. A drain of transistor 228 is coupled to a source of pmos transistor 226 and to a source of nmos transistor 224. A complement of the column select signal, COLB, is provided to a gate of transistor 226 and to a gate of nmos transistor 212. A column select signal, COL, is provided to a gate of transistor 224. Both drains of transistors 226 and 224 are coupled to a data line. A write enable signal, WE, is provided to a gate of nmos transistor 210. A source of transistor 210 is coupled to a drain of transistor 212. A source of transistor 212 is coupled to ground. Transistors 210 and 212 make up a block diagram 202 for indicating a bit line reset circuit diagram. The drain of transistor 210 is coupled to a bit line and to a drain of an nmos transistor 208. Block diagram 200 is for leakage circuitry to bleed off the bit line voltage to a predetermined level and consists of nmos transistor 206 and nmos transistor 208. The drain of nmos transistor 208 is coupled to a bit line and to the drain of transistor 210. A source of transistor 208 is coupled to a drain of transistor 206. A source of transistor 206 is coupled to ground. A clock signal is provided to both gates of transistors 206 and 208 to control the leakage and timing.

The advantages of FIG. 9 include a block diagram 204 to precharge the unselected bit lines to 1.2 volts. Another advantage is to ground the unselected bit lines during a write, preventing an incorrect programming from taking place.

Figure 10:
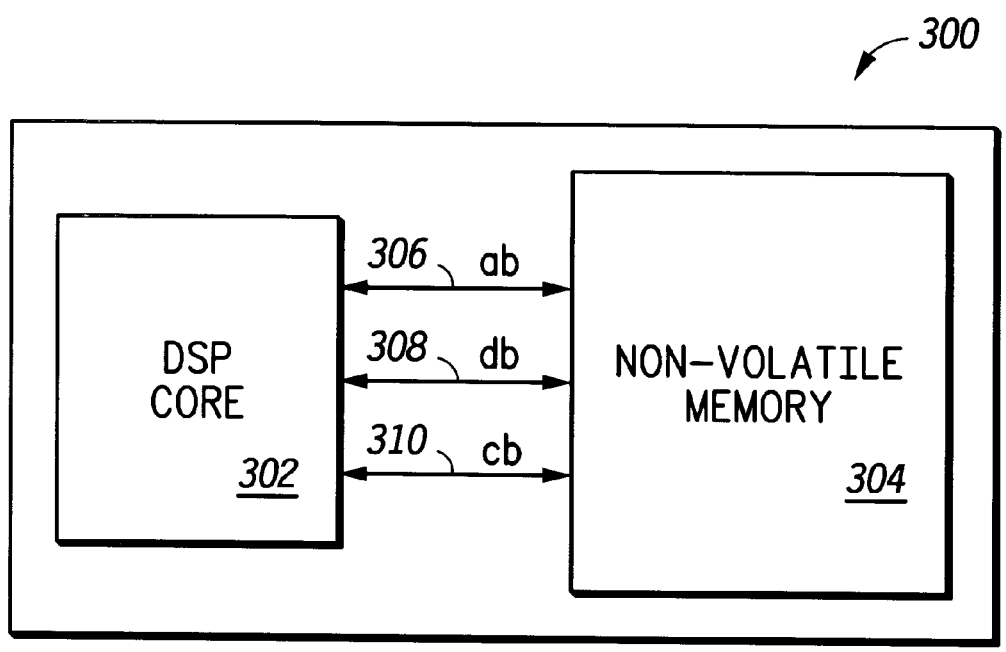
FIG. 10 illustrates an integrated circuit in accordance with the present invention.

FIG. 10 illustrates an integrated circuit in accordance with the present invention. A digital signal processor (DSP) core 302 and a non-volatile memory core 304 are coupled via a variety of bidirectional buses. An address bus 306 transmits addresses between the DSP core and the non-volatile memory core 304. A data bus 308 transmits data and information between the DSP core and the non-volatile memory core 304. A control bus 306 transmits information about setup, priority, interrupts between the DSP core and the non-volatile memory core 304.

The advantages of an integrated circuit include reduction in wiring and increased speed due to closer proximity. The DSP core could be substituted with a microcontroller or microprocessor core.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. A nonvolatile memory circuit comprising:
 a plurality of nonvolatile memory cells arranged in a two dimensional array on a substrate;
 address decoder circuitry coupled to the plurality of nonvolatile memory cells via conductive lines which are responsive to the address decoder circuitry;
 sensing circuitry coupled to the plurality of nonvolatile memory cells for reading data from the plurality of nonvolatile memory cells; and pre-charge circuitry coupled to the plurality of nonvolatile memory cells, wherein data is read from the plurality of nonvolatile memory cells using a pipelined process, the pipelined process having a first time period (T0) which outputs a first data value from a first read operation, precharges a bit line for a second read operation, and selects a word line for a second read operation, a second time period (T1) following the first time period which outputs the first data value from a first read operation, and senses a second data value for the second read operation, a third time period (T2) following the second time period which senses the second data value for the second read operation, and receives an address for a third read operation, a fourth time period (T3) following the third time period which latches the address for the third read operation, decodes the address for the third read operation, and outputs the second data value from the second read operation.

2. The nonvolatile memory circuit of claim 1 wherein the plurality of nonvolatile memory cells are further characterized as a plurality of floating gate memory cells.

3. The nonvolatile memory circuit of claim 1 wherein the data is read from the plurality of nonvolatile memory cells at a 100 MHz rate.

4. The nonvolatile memory circuit of claim 1 wherein a first control signal enables the first time period, a second control signal enables the second time period, a third control signal enables the third time period, and a fourth control signal enables the fourth time period.

5. The nonvolatile memory circuit of claim 1 wherein the sensing circuitry contains a master portion and a slave portion wherein the slave portion is coupled to the master portion.

6. The nonvolatile memory circuit of claim 1 wherein the sensing circuitry contains a sensing portion which has a first input and a second input, the sensing portion being used to sense data provided from a first bank of memory and a second bank of memory, the data from both the first bank of memory and the second bank of memory being provided to the first input of the sensing portion by switching circuitry.

7. The nonvolatile memory circuit of claim 6 wherein a first current reference source is coupled to the second input when the first input is receiving data from the first bank of memory and wherein a second current reference source is coupled to the second input when the first input is receiving data from the second bank of memory.

8. The nonvolatile memory circuit of claim 6 wherein a first switch is coupled to the first input of the sensing portion and a second switch is coupled to the second input of the sensing portion whereby both the first and second switches are turned on while sensing from the first bank of memory to balance parasitics for both the first input and the second input.

9. The nonvolatile memory circuit of claim 8 wherein a third switch is coupled to the first input of the sensing portion and a fourth switch is coupled to the second input of the sensing portion whereby both the third and fourth switches are turned on while sensing from the second bank of memory to balance parasitics for both the first input and the second input.

10. The nonvolatile memory circuit of claim 1 wherein an enable signal from the precharge circuitry is a function of a write enable control signal.

11. The nonvolatile memory circuit of claim 1 wherein an enable signal from the precharge circuitry is a function of a column decode signal and a precharge control signal.

12. The nonvolatile memory circuit of claim 1 wherein a digital signal processor (DSP) is coupled to the nonvolatile memory circuit, and wherein the digital signal processor (DSP) is located on the substrate.

13. A nonvolatile memory circuit comprising:
a plurality of nonvolatile memory cells arranged in a two dimensional array on a substrate;
address decoder circuitry coupled to the plurality of nonvolatile memory cells via conductive lines which are responsive to the address decoder circuitry;
sensing circuitry coupled to the plurality of nonvolatile memory cells for reading data from the plurality of nonvolatile memory cells;
first pre-charge circuitry coupled to the sensing circuitry; and
second pre-charge circuitry coupled to the plurality of nonvolatile memory cells, wherein data is read from the plurality of nonvolatile memory cells using a pipelined process, the pipelined process having a first time period (T0) which precharges the sensing circuitry for a first read operation, senses a first data value for the first read operation, and decodes a first address for a second read operation, a second time period (T1) following the first time period which outputs the first data value from the first read operation, latches a word line for a second read operation, and pre-charges a bit line for the second read operation, a third time period (T2) following the second time period which outputs the first data value from the first read operation, precharges the sensing circuitry for a second read operation, senses a second data value for the second read operation, and receives a second address for a third read operation; and a fourth time period (T3) following the third time period which outputs the first data value for the first read operation, senses the second data value for the second read operation, and latches the second address for the third read operation.

14. The nonvolatile memory circuit in claim 13 wherein the sensing circuitry comprises a reference circuit and a differential amplifier.

15. The nonvolatile memory circuit in claim 14 wherein the reference circuit comprises a plurality of switches which are switched to balance parasitics between a first input of the sensing circuitry and a second input of the sensing circuitry.

16. The nonvolatile memory circuit in claim 13 wherein the sensing circuitry comprises a first latch and a second latch.

17. The nonvolatile memory circuit of claim 13 wherein the plurality of nonvolatile memory cells are further characterized as a plurality of floating gate memory cells.

18. A nonvolatile memory circuit comprising:
a plurality of nonvolatile memory cells arranged in a two dimensional array on a substrate;
address decoder circuitry coupled to the plurality of nonvolatile memory cells via conductive lines which are responsive to the address decoder circuitry;
sensing circuitry coupled to the plurality of nonvolatile memory cells for reading data from the plurality of nonvolatile memory cells; and
pre-charge circuitry coupled to the plurality of nonvolatile memory cells, wherein data is read from the plurality of nonvolatile memory cells using a pipelined process, the pipelined process having a first time period (T0) which outputs a first data value from a first read operation, selects a word line for a second read operation, and senses a second data value for the second read operation, a second time period (T1) following the first time period which senses the second data value for the second read operation, a third time period (T2) following the second time period which outputs the second data value for the second read operation, and receives an address for a third read operation, and a fourth time period (T3) following the third time period which outputs the second data value for the second read operation, decodes the address for the third read operation, and precharges a bit line for the third read operation.

19. The nonvolatile memory circuit in claim 18 wherein the sensing circuitry comprises a reference circuit and a differential amplifier.

20. The nonvolatile memory circuit in claim 19 wherein the reference circuit comprises a plurality of switches which are switched to balance parasitics between a first input of the sensing circuitry and a second input of the sensing circuitry.

21. The nonvolatile memory circuit in claim 18 wherein the sensing circuitry comprises a first latch and a second latch.

22. The nonvolatile memory circuit of claim 18 wherein the plurality of nonvolatile memory cells are further characterized as a plurality of floating gate memory cells.

23. A nonvolatile memory circuit comprising:
a plurality of floating gate memory cells on a substrate;
address decoder circuitry coupled to the plurality of floating gate memory cells;
sensing circuitry coupled to the plurality of floating gate memory cells, the sensing circuitry having a master portion and a slave portion, wherein the slave portion is coupled to the master portion and the slave portion outputs a first data value for a first read operation while the master portion senses a second data value for a second read operation;
pre-charge circuitry coupled to the plurality of floating gate memory cells, wherein at least one bit line in the plurality of floating gate memory cells is precharged by the pre-charge circuitry before being sensed by the sensing circuitry; and
wherein the first data value and the second data value are read from the plurality of floating gate memory cells using a pipelined process.

24. The nonvolatile memory circuit in claim 23 further comprising a current reference source coupled to the sensing circuitry.

25. The nonvolatile memory circuit of claim 23, further comprising a digital signal processor (DSP), wherein the digital signal processor (DSP) is coupled to the nonvolatile memory circuit and is located on the substrate.

26. A nonvolatile memory circuit comprising:
a plurality of floating gate memory cells comprising a first memory bank and a second memory bank on a substrate;
address decoder circuitry coupled to the plurality of floating gate memory cells;
sensing circuitry coupled to the plurality of floating gate memory cells, the sensing circuitry having a first current reference source, a second current reference source and a sensing portion, wherein the first current reference source is coupled to the sensing portion when the sensing portion is sensing the first memory bank, and wherein the second current reference source is coupled to the sensing portion when the sensing portion is sensing the second memory bank;
pre-charge circuitry coupled to the plurality of floating gate memory cells, wherein at least one bit line within the plurality of floating gate memory cells is pre-charged by the pre-charge circuitry before being sensed by the sensing circuitry; and
wherein data values from the plurality of floating gate memory cells are read using a pipelined process.

27. The nonvolatile memory circuit of claim 26, further comprising a digital signal processor (DSP), wherein the digital signal processor (DSP) is coupled to the nonvolatile memory circuit and is located on the substrate.

* * * * *